(12) United States Patent
Hall et al.

(10) Patent No.: US 6,788,222 B2
(45) Date of Patent: Sep. 7, 2004

(54) LOW WEIGHT DATA ENCODING FOR MINIMAL POWER DELIVERY IMPACT

(75) Inventors: Stephen H. Hall, Hillsboro, OR (US); Michael W. Leddige, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 642 days.

(21) Appl. No.: 09/759,245

(22) Filed: Jan. 16, 2001

(65) Prior Publication Data

US 2002/0138805 A1 Sep. 26, 2002

(51) Int. Cl.[7] .............................................. H03M 7/00
(52) U.S. Cl. .......................................... 341/50; 341/58
(58) Field of Search .............................. 341/50, 51, 60, 341/106, 58

(56) References Cited

U.S. PATENT DOCUMENTS 5,940,018 A * 8/1999 Kim et al. .................... 341/94
6,304,196 B1 * 10/2001 Copeland et al. ............. 341/58
6,366,223 B1 * 4/2002 Lee et al. ..................... 341/51

* cited by examiner

Primary Examiner—Brian Young
Assistant Examiner—John B Nguyen
(74) Attorney, Agent, or Firm—Kenyon & Kenyon (57) ABSTRACT

A low weight encoding circuit of a power delivery system for encoding data sent out on an I/O bus with minimal current drawn so as to minimize signal and timing distortions. Such a low weight encoding circuit comprises a current balance tester arranged to test whether a predetermined number of data bits is current balanced; a current balance encoder and decode bit generator arranged to encode data bits and generate encoded data and corresponding decode bits if the predetermined number of data bits is not current balanced; and a latch arranged to latch either the data bits, via an I/O bus, if said predetermined number of data bits is current balanced or the encoded data and corresponding decode bits, via the I/O bus, if the predetermined number of data bits is not current balanced.

20 Claims, 8 Drawing Sheets

LOW WEIGHT DATA ENCODING FOR MINIMAL POWER DELIVERY IMPACT

TECHNICAL FIELD

The present invention relates to high-speed bus technologies, and more particularly, relates to low weight data encoding circuitry and methods of encoding data sent out on a data (I/O) bus such that there is minimal net current drawn from the local power delivery system due to switching I/O cells across a predetermined number of bits.

BACKGROUND

In recent years, technological advances in electronic systems have demanded ever-higher functionality, ever-faster circuit speeds, and always increasing interconnection density. Semiconductor technology has well kept up with advancing system requirements. However, the basic interconnection technology, namely printed circuit boards and substrates for high-speed digital components and active circuits, such as processors, chipsets, and I/O devices, has not always followed due to the complex nature of impedance, switching noise, system noise, power distribution inductances and decoupling characteristics.

For example, I/O cells of a high-speed active circuit, such as a chipset or a processor, require a power-ground decoupling network that will deliver high frequency transient current to the switching output transistors (i.e., logic gates). If the network is not designed properly, the system performance will be degraded.

Currently, there are two methods that may be used to ensure that the high frequency transient current is cleanly delivered to the switching output transistors of the active circuit.

One method is known as the traditional "heavy decoupling" method which relies on large numbers of capacitors placed in very close proximity to the I/O cells either on the chip package or the printed circuit board (PCB) to provide a charge reservoir and deliver high frequency current to the I/O cells. However, if there is a significant amount of inductance in series with the decoupling capacitance (i.e., planes, vias, bond wires, etc.), the transient current that can be instantaneously delivered to the I/O cells will be limited, and switching noise will be injected onto the power delivery system which can significantly degrade both the timing and the signal integrity if too many I/O cells are switching simultaneously. The extra inductance is typically caused by the plane inductance of the chip package/PCB (i.e., physical distance to the capacitor), and via structures used to connect the capacitors to the appropriate power planes. These signal integrity and timing distortions often precipitate severe distortions in modern chip designs. For instance, validation vehicles for advanced processors such as Pentium® IV manufactured by Intel Corp., show severe waveform distortions on the front side bus (FSB) due to resonance phenomena that are directly caused by insufficient capacitance at the chipset. In addition, simulations performed during the design of Pentium® IV systems indicate a 125 ps timing skew impact due to inadequate decoupling at the chipset. One way to minimize signal and timing distortion is to dramatically increase the amount of capacitance per I/O cell on the die and minimize the inductance. However, the production cost for chipsets will be excessive.

The second method is known as the "data bus inversion" method which seeks to invert ½ of the system bus (the left half or the right half) if the majority of the data bits from the I/O cells are switching high. This will decrease the amount of transient current flowing into the local decoupling network and reduce the total switching noise caused by inductances inherent in the local power delivery system. However, large inductive current loops are created because the current balance is not distributed across the system bus, and the total current drawn through the local decoupling network is not minimized sufficiently for modem high speed designs.

As a result, there is no way to sufficiently decouple active circuits such as chipsets or processors so as to adequately meet the power delivery demands of the I/O cells with minimal cost and real estate (physical space). It is also very expensive to add large amounts of on-die capacitance and there is physically no room on the chipset to implement solutions usually used on typical processors, such as land side or die side capacitors, which are the only options known that will increase the capacitance without dramatically increasing the series inductance. Moreover, as speeds increase, the amount of tolerable inductance will become so small that discrete capacitors are entirely infeasible for I/O decoupling purposes.

Accordingly, there is a need to circumvent problems inherent with the "heavy decoupling" and "data-bus inversion" techniques so as to ensure signal integrity and minimize timing distortion. Also needed is a solution to encode data sent out on an I/O bus such that the net current drawn from the local power delivery system is minimized, and the switching noise is significantly reduced, if not entirely eliminated.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable for use with all types of electronic systems, power delivery systems, I/O buses, interconnection technologies and active circuits such as processors and chipsets, including new chipsets and electronic devices which may become available as computer and electronic technology develops in the future. For example, I/O buses may be a 32-bit bus or a 64-bit data or system bus. However, for the sake of simplicity, discussions will concentrate mainly on exemplary use of a simplified power delivery system for a predetermined number of data bits (e.g., a nibble of 4 bits) and low weight encoding circuitry for encoding those data bits such that there is minimal current drawn from the power delivery system due to switching I/O cells across the predetermined number of data bits, although the scope of the present invention is not limited thereto.

Figure 1:
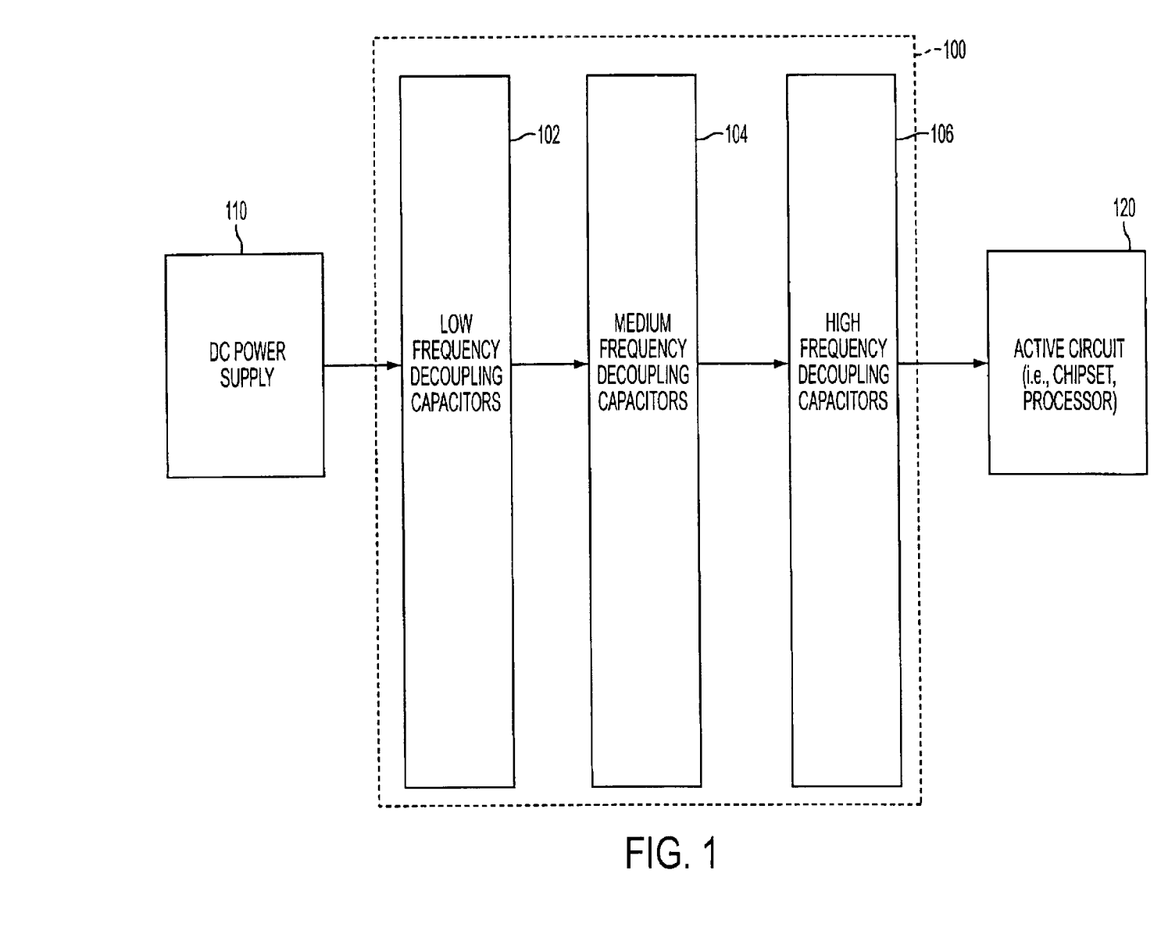
FIG. 1 illustrates a basic power delivery system for an active circuit of an electronic system.

Attention now is directed to the drawings and particularly to FIG. 1, a basic power delivery system for an active circuit in an electronic system is illustrated. Examples of such an active circuit include a chipset, a processor and an I/O device comprising a plurality of switching output transistors (I/O cells). The power delivery system 100 is typically arranged to deliver a transient current from a power supply 110 to an active circuit 120 upon request.

As shown in FIG. 1, the power delivery system 100 may rely on large numbers of capacitors placed in very close proximity to the I/O cells of the active circuit 120 to provide a charge reservoir and deliver high frequency current to the I/O cells. For example, different sets of decoupling capacitors such as low-frequency decoupling capacitors 102, medium-frequency decoupling capacitors 104 and high-frequency decoupling capacitors 106 may be arranged to provide a charge reservoir and delivered transient current to the I/O cells. However, the transient current is often limited by power distribution inductances and decoupling capacitances, and switching noise is injected onto the power delivery system 100 which can significantly degrade both the timing and the signal integrity of the electronic system.

Figure 2:
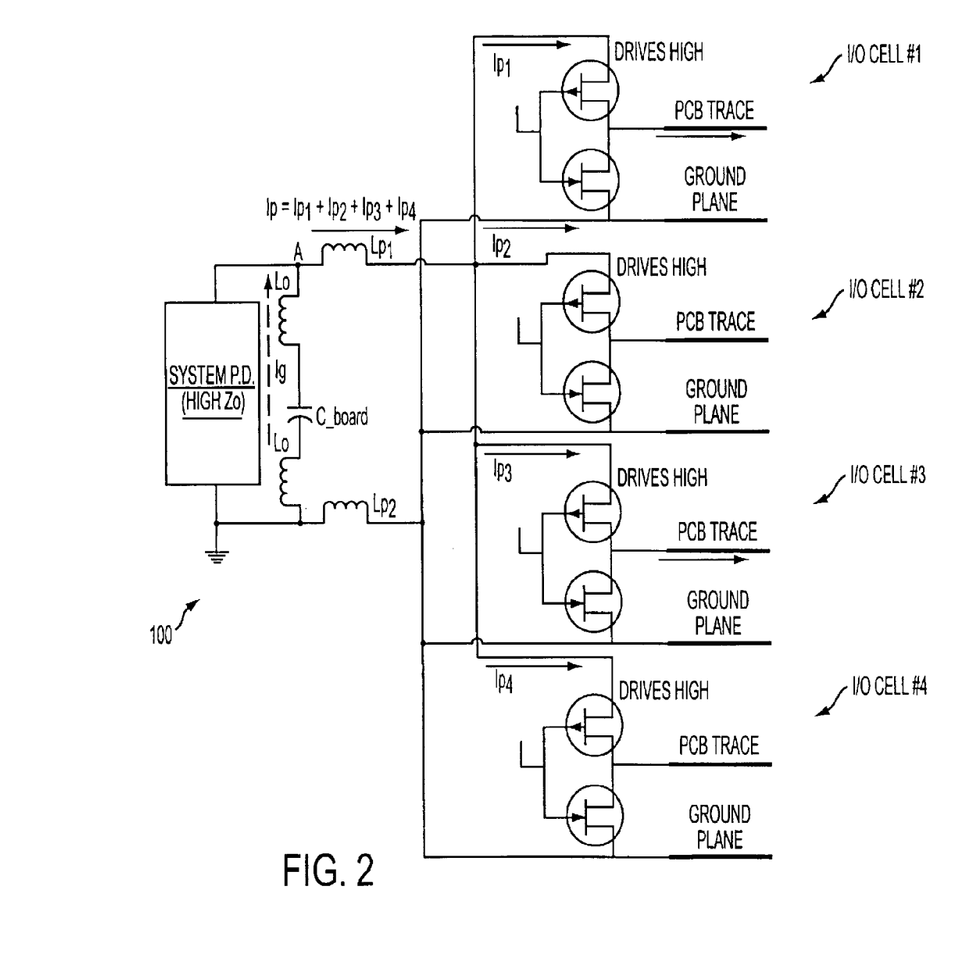
FIG. 2 illustrates a simplified power delivery system for a predetermined number of data bits (nibble)

To understand the physical mechanism of timing and the signal integrity problems, refer to FIG. 2, which illustrates a simplistic power delivery model for a predetermined number of data bits. The predetermined number of data bits may correspond, for example, to 4 bits or a data nibble from the I/O bus for the sake of simplicity. The I/O bus (data bus or system bus) may support at least 32-bit or 64-bit transactions. As shown in FIG. 2, the power delivery system 100 has four (4) I/O cells #1 to #4 at output stages. Each I/O cell has a pair of transistors (usual CMOS transistors) which serve as a switch. For example, I/O cell #1 includes transistors T1$a$ and T1$b$; I/O cell #2 includes transistors T2$a$ and T2$b$; I/O cell #3 includes transistors T3$a$ and T3$b$; and I/O cell #4 includes transistors T4$a$ and T4$b$.

When all four (4) bits switch high, for example, each PMOS device will pull current out of the power delivery system 100. Since the power supply (see FIG. 1) is physically far away and subsequently cannot provide the required current, the local decoupling capacitors (system P.D and board capacitor $C_{board}$), which are charged, will discharge and provide the necessary current to the output drivers (not shown). However, series inductance Lc and Lp1-Lp2 to the board capacitor $C_{board}$ (i.e., planes, vias, bond wires, etc.) will limit the amount of current that can be instantaneously delivered and will inject a noise onto the power delivery system of $L_{tot} \cdot dIp/dT$, where Ip=Ip1+Ip2+Ip3+Ip4 and where $L_{tot}$ is the total series inductance between the I/O cell #1 to I/O cell #4 and the nearest decoupling capacitance. This noise significantly degrades both the timing and the signal integrity if too many I/O cells are switching simultaneously. Either the traditional "heavy decoupling" technique or the "data-bus inversion" technique can be used to minimize signal and timing distortions. However, neither technique provides desirable results since large amounts of on-die decoupling capacitance which tends to be very costly, especially for chipsets, are required (i.e., on chip package/PCB), and large inductive current loops are created because the current balance is not distributed across the system bus.

Figure 3:
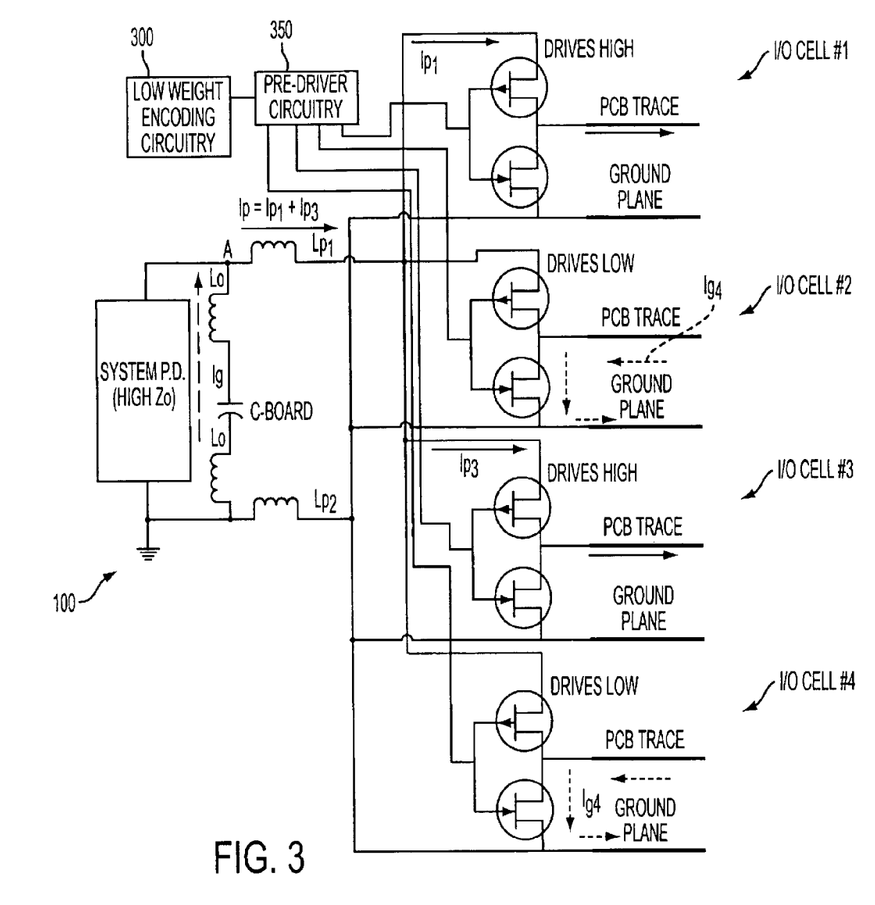
FIG. 3 illustrates a simplified power delivery system having low weight encoding circuitry for a predetermined number of data bits (nibble) according to an embodiment of the present invention.

Turning now to FIG. 3, a simplified power delivery system 100 having low weight encoding circuitry 300 for a predetermined number of data bits (nibble) according to an embodiment of the present invention is illustrated. The low weight encoding circuitry 300 may be implemented to encode data sent out on an I/O bus such that there is minimal current drawn from the local power delivery system 100 due to switching I/O cells across a predetermined number of bits so as to ensure signal integrity and minimize timing distortion. In addition, pre-driver circuitry 350 may also be included to draw the transient current from the local power delivery system 100 to the low weight encoding circuitry 300 for encoding purposes.

Minimal current drawn is achieved by ensuring that two (2) bits in each nibble of the I/O bus are always switching opposite of the other two bits. This will ensure that the net current, Ip, as depicted in FIG. 3, is always minimal. For example, refer to FIG. 3, if I/O cells #1 and #3 are switching high, and I/O cells #2 and #4 are switching low, then the net current summed at node A may be shown by equation 1 as follows.

$$Ip=Ip1+Ig3 \qquad \text{(Equation 1)}$$

The return current generated by the low switching bits (I/O cells #2 and #4) are not forced to pass through the local decoupling capacitors (system P.D and board capacitor $C_{board}$). Subsequently, the noise described above may be reduced by a factor of two. However, the amount of current reduction may be dependant on the type of buffer used. For example, if a buffer is designed to draw source current out of the power delivery system 100 during a high transition and sink current during a low transition, the net current forced to flow though local decoupling capacitors (system P.D and board capacitor $C_{board}$) may be zero (0).

The minimized current drawn is achieved by sampling the data bits one transaction period prior to being driven onto the I/O bus in four bit chunks (nibbles) and testing for current balance. If the nibble is already current balanced (i.e., two bits high and two bits low), then the data is driven directly onto the I/O bus at the next bus transition. If the nibble is not current balanced, then it will be encoded so that it is current balanced before it is driven onto the I/O bus.

Figure 4:
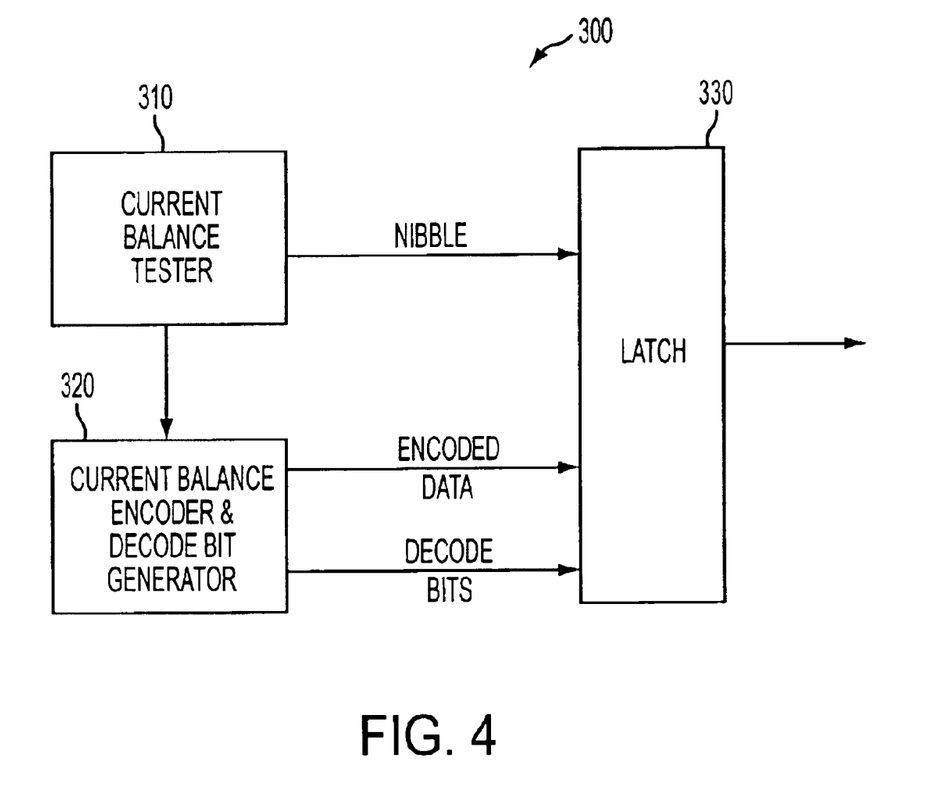
FIG. 4 illustrates an example low weight encoding circuitry for encoding data according to an embodiment of the present invention.

FIG. 4 illustrates an example low weight encoding circuitry 300 for encoding data according to an embodiment of the present invention. As shown in FIG. 4, the low weight encoding circuitry 300 may comprise a current balance tester 310 arranged to test whether the four (4) bit chunk (nibble) is current balanced (i.e., two bits high and two bits low); a current balance encoder & decode bit generator 320 arranged to encode data (nibble) and generate encoded data and corresponding decode bits if the four (4) bit chunk (nibble) is not current balanced; and a latch 330 arranged to latch either the data nibble to output stages, via the I/O bus if the four (4) bit chunk (nibble) is current balanced or the encoded data (nibble) and corresponding decode bits to output stages, via the I/O bus if the four (4) bit chunk (nibble) is not current balanced.

Figure 5:
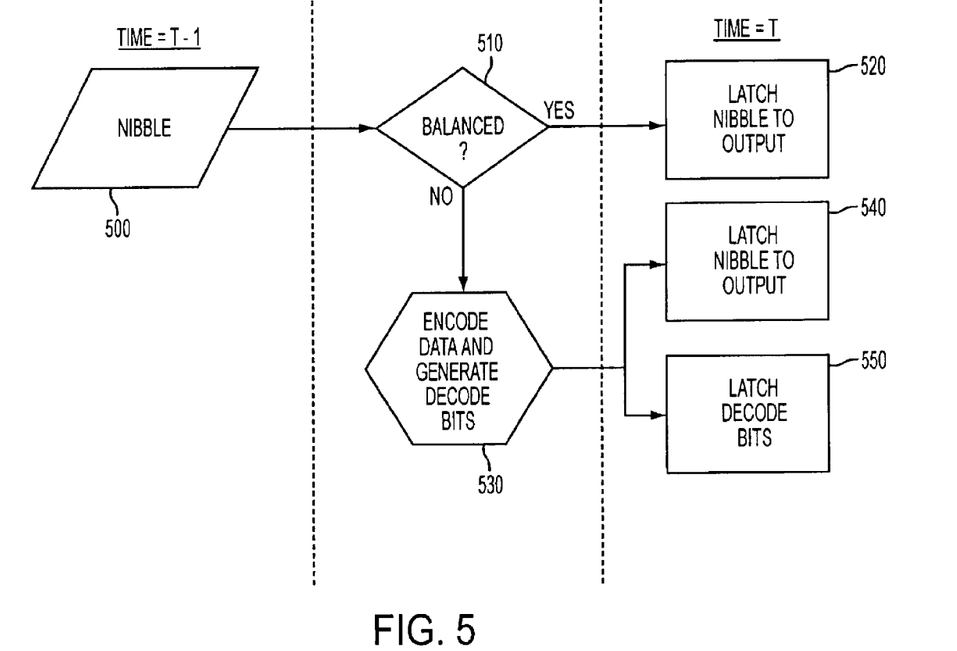
FIG. 5 illustrates a flow diagram of a simplified example power delivery system having low weight encoding circuitry for a predetermined number of data bits (nibble) according to an embodiment of the present invention.

FIG. 5 illustrates a flow diagram of an example low weight encoding circuitry 300 for encoding data shown in FIG. 4. Data bits in a four bit chunk (nibble) may be sampled at one transaction period (time=T−1) at block 500 prior to being driven onto the I/O bus and testing for current balance. The current balance tester 310 then determines if the data nibble is already current balanced (i.e., two bits high and two bits low) at block 510. If the nibble is already current balanced (i.e., two bits high and two bits low), the latch 300 latches the data nibble to the output onto the I/O bus at the next bus transition (time=T) at block 520. However, if the data nibble is not current balanced (i.e., two bits high and two bits low), the current balance encoder & decode bit generator 320 encodes the data nibble to ensure that the data nibble is current balanced prior to being driven onto the I/O bus and generates therefrom encoded data and corresponding decode bits at block 530. Decode bits are control bits assigned to particular encoded nibbles and are sent along with the encoded nibbles to inform the receiver (decoder) how to decode the encoded nibbles for data reconstruction. The latch 300 then latches the encoded nibbles and the decode bits to the output onto the I/O bus at the next bus transition (time=T) at block 540 and block 550.

More specifically, the current balance tester 310 may be implemented using combinations of Boolean logics including, but not limited to, XOR and XNOR logic gates arranged to test a data nibble for balanced current drawn using $A_0$, $A_1$, $A_2$ and $A_3$ as parameters representing individual bits in a data nibble of four (4) data bits and the following equations: where $A_0$ through $A_3$ represent individual bits in a data nibble of four (4) data bits.

In order to test for balanced currents within 1 data nibble, XNOR and XOR functions may be applied, as shown in equations 2–6 hereinbelow. Note here that the XNOR function produces a 1 if both bits being compared are identical (00 or 11) and a 0 otherwise (01 or 10) and XOR produces a 1 only if the bits are different (01 or 10).

$$F_1 = \overline{A_0 \oplus A_1} \quad \text{(Equation 2)}$$

$$F_2 = \overline{A_2 \oplus A_3} \quad \text{(Equation 3)}$$

$$F_3 = \overline{F_1 \oplus F_2} \quad \text{(Equation 4)}$$

$$F_4 = A_0 \oplus A_1 \oplus A_2 \oplus A_3 \quad \text{(Equation 5)}$$

$$\text{If } F_3 \cdot F_4 = 1; \text{ Then balanced} \quad \text{(Equation 6)}$$

Figure 6A:
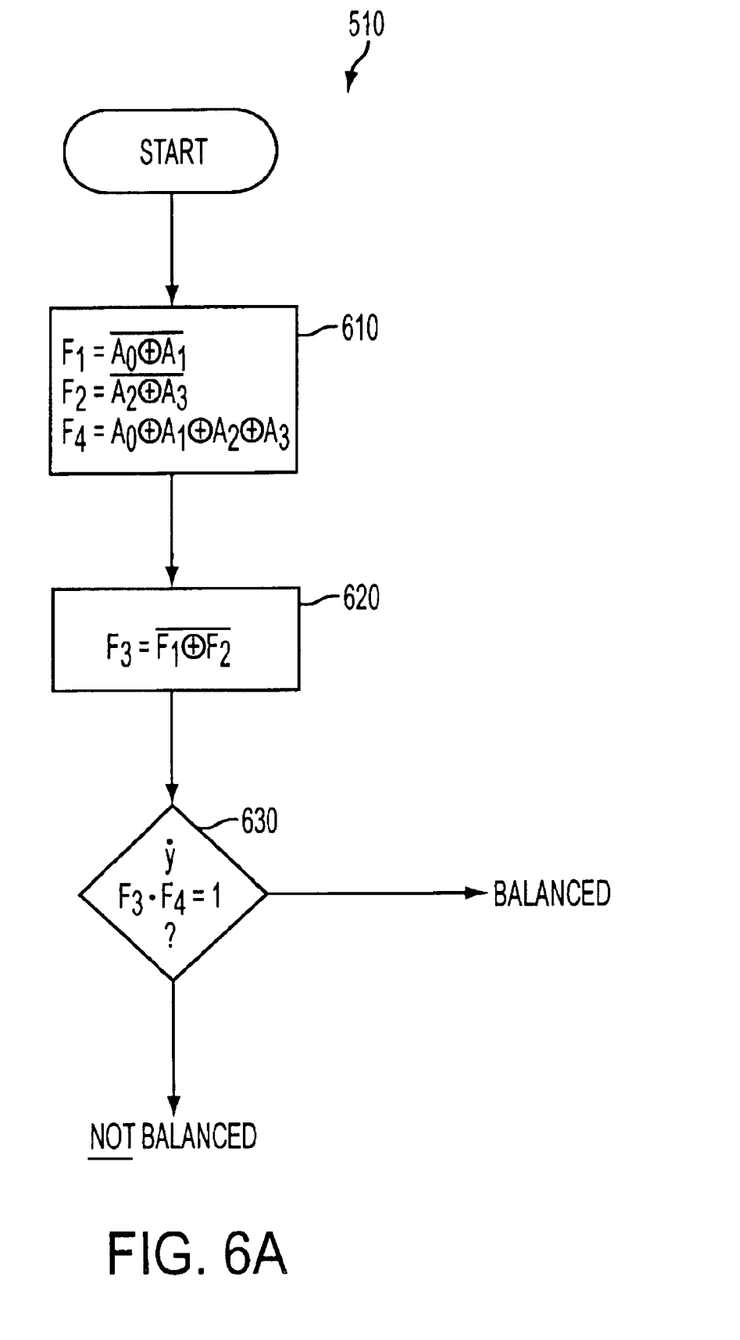
FIG. 6A illustrates a process of determining if a predetermined number of data bits (nibble) is current balanced according to an embodiment of the present invention.

FIG. 6A illustrates a process performed by a current balance tester 310 of the low weight encoding circuitry 300 for determining if a data nibble is current balanced according to an embodiment of the present invention. As shown in FIG. 6A, the current balance tester 310 may be configured to perform the steps of determining Boolean XNOR functions, $F_1 = \overline{A_0 \oplus A_1}$, $F_2 = \overline{A_2 \oplus A_3}$, and $F_4 = A_0 \oplus A_1 \oplus A_2 \oplus A_3$ at block 610, a Boolean XOR function, $F_3 = \overline{F_1 \oplus F_2}$ at block 620, and then determining if functions if $F_3 \cdot F_4 = 1$ at block 630.

If $F_3 \cdot F_4 = 1$, then the data nibble is current balanced at block 630. The data nibble may then be latched by the latch 330 directly onto the I/O bus. Otherwise, if $F_3 \cdot F_4 \neq 1$ at block 630, then the data nibble is not current balanced and therefore needs to be encoded by the current balance encoder & decode bit generator 320 so that the data nibble is current balanced before driven onto the I/O bus.

Figure 6B:
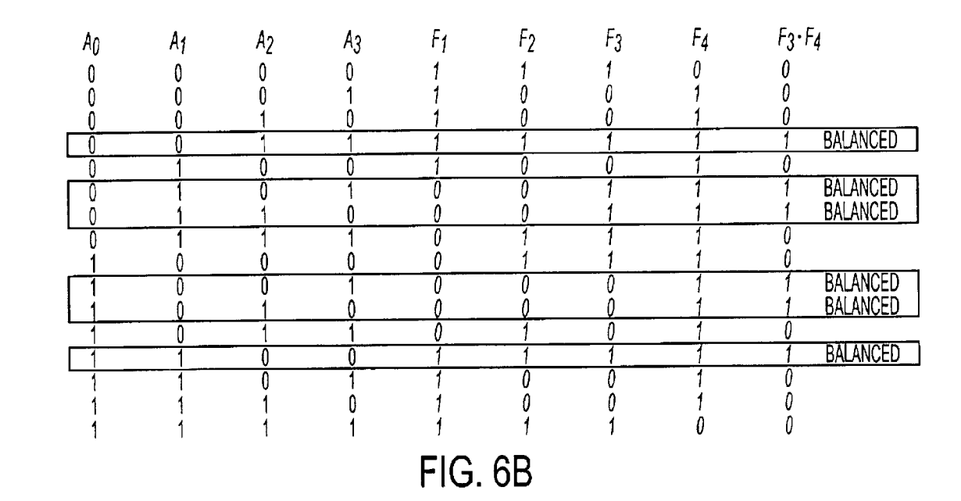
FIG. 6B illustrates TABLE #1 including balance currents within one (1) nibble according to an embodiment of the present invention.

FIG. 6B illustrates a TABLE#1 of balance currents within 1 nibble according to an embodiment of the present invention. Since each data nibble has four (4) data bits, $A_0$, $A_1$, $A_2$ and $A_3$, there may be sixteen (16) combinations of data bits and sixteen (16) combinations of XNOR and XOR functions $F_1$, $F_2$, $F_3$ and $F_4$. The data nibble is current balanced when $F_3 \cdot F_4 = 1$. Therefore, data nibbles $A_0$, $A_1$, $A_2$ and $A_3$ [0011], [0101], [0110], [1001], [1010] and [1100] as shown in TABLE #1 are already current balanced. Only those data bits of the nibble $A_0$, $A_1$, $A_2$ and $A_3$ that are not current balanced, for example, [0000], [0001], [0010], [0100], [0111], [1000], [1011], [1101], [1110] and [1111] need to be encoded by the current balance encoder & decode bit generator 320 so that the data nibble is current balanced before driven onto the I/O bus.

In another embodiment of the present invention, the current balance tester 310 of the low weight encoding circuitry 300 may be implemented using a look-up TABLE as shown in FIG. 6B. This way XNOR and XOR functions $F_1$, $F_2$, $F_3$ and $F_4$ need not be logically performed by Boolean logic gates. Rather, the XNOR and XOR functions $F_1$, $F_2$, $F_3$ and $F_4$ are pre-assigned to different combinations of an input data nibble $A_0$, $A_1$, $A_2$ and $A_3$.

Figure 7A:
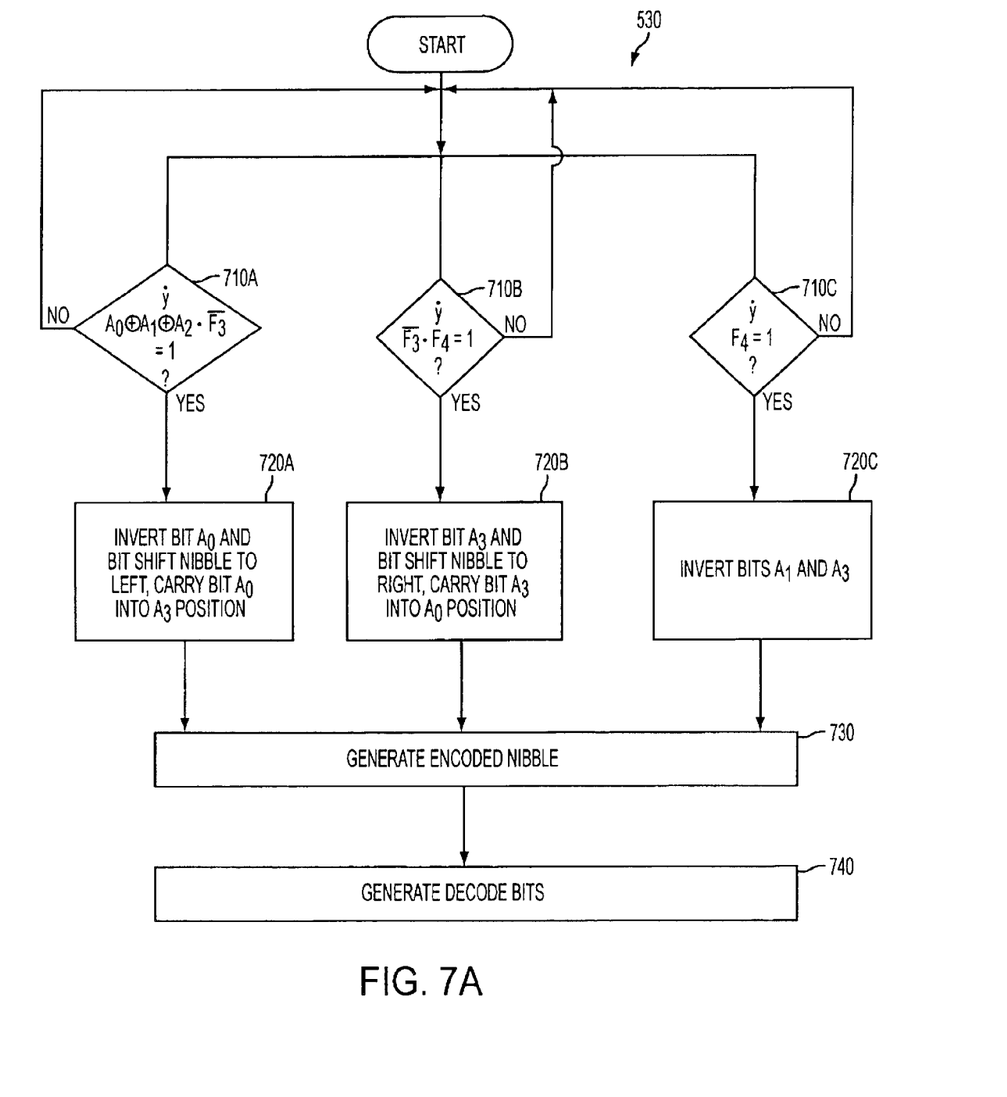
FIG. 7A illustrates a process of encoding a predetermined number of data bits (nibble) when the data nibble is not current balanced according to an embodiment of the present invention.

FIG. 7A illustrates a process performed by a current balance encoder & decode bit generator 330 of the low weight encoding circuitry 300 for encoding a predetermined number of data bits (nibble) when the nibble is not current balanced according to an embodiment of the present invention. The current balance encoder & decode bit generator 330 may be configured to encode the data nibble in three different ways, depending on the bit pattern so as to ensure balanced current drawn:

1. Invert bit $A_3$ and bit shift the nibble to the right, carry bit $A_3$ into the $A_0$ position.
2. Invert bit $A_0$ and bit shift the nibble to the left, carry bit $A_0$ into the $A_3$ position.
3. Invert bits $A_1$ and $A_3$ The method of encoding depends on the initial bit pattern $A_0$, $A_1$, $A_2$ and $A_3$ contained data nibble. The following Boolean functions can be used to determine the correct encoding sequence to ensure balanced current drawn:

1. If the data nibble is already current balanced, then equation #6 applies and the data nibble need not be encoded.
2. If $\overline{A_0 \oplus A_1 \oplus A_2 \cdot F_3} = 1$, then invert bit $A_0$ and left shift
3. If $\overline{F_3} \cdot F_4 = 1$, then invert bit $A_3$ and shift right
4. If $F_4 = 1$, then invert bits $A_1$ and $A_3$.

These Boolean functions are also used to set the decode (control) bits. For each nibble of four (4) data bits, two control bits are required to decode because there are four (4) possible encoding options (listed above). The decode (control) bits are necessary to inform the receiver (decoder) how the data was encoded so that the original bit pattern can be recovered.

As shown in FIG. 7A, the current balance encoder & decode bit generator 330 may be configured to encode a data nibble if the data nibble is not current balanced as follows. First, the current balance encoder & decode bit generator 330 determines if $\overline{A_0 \oplus A_1 \oplus A_2 \cdot F_3} = 1$ at block 710A, if $\overline{F_3} \cdot F_4 = 1$ at block 710B, and if $F_4 = 1$ at block 610C. These determinations can be made in series or simultaneously so long as any one of conditions is met.

For example, if $\overline{A_0 \oplus A_1 \oplus A_2 \cdot F_3} = 1$ at block 710A, the current balance encoder & decode bit generator 330 inverts bit $A_0$ and bit shift the nibble to the left, carry bit $A_0$ into the $A_3$ position at block 720A, generates encoded nibble at block 730 and corresponding decode (control) bits at block 740.

If $\overline{F_3} \cdot F_4=1$ at block 710B, the current balance encoder & decode bit generator 330 inverts bit $A_3$ and bit shift the nibble to the right, carry bit $A_3$ into the $A_0$ position at block 720B, generates encoded nibble at block 730 and corresponding decode (control) bits at block 740.

If $F_4=1$ at block 710C, the current balance encoder & decode bit generator 330 inverts bits $A_1$ and $A_3$ at block 720C, generates encoded nibble at block 730 and corresponding decode (control) bits at block 740.

Figure 7B:
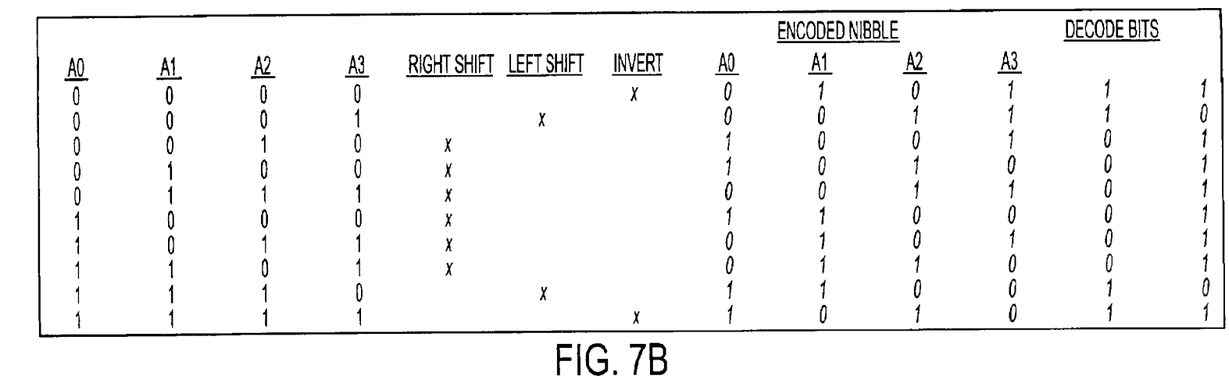
FIG. 7B illustrates TABLE #2 including encoding sequences for data nibbles that are not balanced shown in FIG. 7A.

FIG. 7B illustrates a TABLE #2 of encoding sequences for nibbles that are not balanced shown in TABLE #1 of FIG. 6B. For example, only data nibbles $A_0$, $A_1$, $A_2$ and $A_3$ that are not current balanced, such as [0000], [0001], [0010], [0100], [0111], [1000], [1011], [1101], [1110] and [1111] need to be encoded to ensure that the net current drawn from a nibble is always zero (0). The decode (control) bits are sent along with the data nibble so the receiver (decoder) understands how to decode the data. This encoding sequence should be performed on each nibble in the data word one bus transaction period prior to driving data onto the I/O bus, so as to ensure that there is net zero current drawn from the local power delivery system 100 due to I/O switching.

In another embodiment of the present invention, the current balance encoder & decode bit generator 330 of the low weight encoding circuitry 300 may be implemented using a look-up TABLE #2 as shown in FIG. 7B. This way inversion and shift functions need not be logically performed by Boolean logic gates. Rather, encoded nibbles are pre-assigned to different combinations of input data nibbles $A_0, A_1, A_2$ and $A_3$ from TABLE #1 that need to be encoded.

For example, for an input data nibble $A_0$, $A_1$, $A_2$ and $A_3$ [0100] as shown in TABLE #2, the pre-assigned encoded nibble $A_0, A_1, A_2$ and $A_3$ may be [1010] and assigned decode (control) bits may be [01].

For an input data nibble $A_0$, $A_1$, $A_2$ and $A_3$ [0111] as shown in TABLE #2, the pre-assigned encoded nibble $A_0$, $A_1, A_2$ and $A_3$ may be [0011] and assigned decode (control) bits may also be [01].

Decode (control) bits are used to inform the receiver (decoder) how to decode the data nibble for data reconstruction. Such decode (control) bits may be two bits required to decode because there are four (4) possible encoding options. Initially, this may seem inefficient, however, as the I/O bus grows, the numbers of decode (control) bits become much smaller percentage of the total number of data bits. This is demonstrated as follows:

| Data Bus Width | Control Bus Width | Increase in I/O |
| --- | --- | --- |
| 4 | 2 | 50% |
| 8 | 3 | 38% |
| 16 | 4 | 25% |
| 32 | 5 | 16% |
| 64 | 6 | 9% |

In addition, the encoding scheme does not necessarily translate into an increase in total pin count. In fact, the encoding scheme will likely decrease the total number of pins because the total number of power and ground pins can be significantly decreased. This is true because the power delivery requirements to support the I/O transients is significantly reduced because minimal current through the decoupling is guaranteed. Moreover, typical CMOS systems require a minimum of 1 power and 1 ground pin be routed in close proximity to each signal pin. Therefore, this encoding scheme may dramatically reduce this ratio.

In order to minimize the problem of unbalanced currents in the control bus, the control bits may be distributed along the entire width of the control bus. Alternatively, a small isolated control bit bus will not need large amount of decoupling because it will not draw a significant amount of current.

As described from the foregoing, the present invention advantageously provides low weight data encoding circuitry for encoding data sent out on an I/O bus such that the net current drawn from the local power delivery system is minimized, and the switching noise is significantly reduced, if not entirely eliminated, while circumventing problems inherent with the traditional "heavy decoupling" and "data-bus inversion" techniques so as to ensure signal integrity and minimize timing distortion. Such low weight encoding circuitry sufficiently decouples active circuits such as chipsets or processors so as to adequately meet the power delivery demands of the I/O cells with minimal cost and real estate (physical space). Moreover, the low weight data encoding circuitry advantageously extends the life of non-differential high-speed bus technologies, reduce risk by minimizing the timing uncertainty due to SSO effects and save money because expensive decoupling schemes need not be implemented at the chipset.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A low weight encoding circuit comprising:
   a current balance tester arranged to test whether a predetermined number of data bits is current balanced;
   a current balance encoder and decode bit generator arranged to encode data bits and generate encoded data and corresponding decode bits if said predetermined number of data bits is not current balanced; and
   a latch arranged to latch either the data bits, via an I/O bus, if said predetermined number of data bits is current balanced or the encoded data and corresponding decode bits, via the I/O bus, if said predetermined number of data bits is not current balanced.

2. The low weight encoding circuit as claimed in claim 1, wherein said predetermined number of data bits corresponds to 4 bits or a data nibble from the I/O bus supporting at least 32-bit or 64-bit data transactions.

3. The low weight encoding circuit as claimed in claim 2, wherein said current balance tester receives the data nibble at one bus transition, determines if the data nibble is already current balanced (i.e., two bits high and two bits low), and if the data nibble is already current balanced, allows the data nibble to latch onto the I/O bus at the next bus transition.

4. The low weight encoding circuit as claimed in claim 2, wherein said current balance encoder and decode bit generator encodes the data nibble to ensure that the data nibble is current balanced prior to being driven onto the I/O bus and generates therefrom encoded data and corresponding decode bits, and allows the encoded data and corresponding decode bits to latch onto the I/O bus at the next bus transition.

5. The low weight encoding circuit as claimed in claim 2, wherein said current balance tester is implemented using combinations of Boolean logics including, but not limited to, XOR and XNOR logic gates arranged to test the data nibble for balanced current drawn using $A_0$, $A_1$, $A_2$ and $A_3$ as parameters representing individual bits in the data nibble of four (4) data bits and the following equations: (1)$F_1 = \overline{A_0 \oplus A_1}$, (2) $F_2 = \overline{A_2 \oplus A_3}$, (3) $F_3 = \overline{F_1 \oplus F_2}$, (4) $F_4 = A_0 \oplus A_1 \oplus A_2 \oplus A_3$ and (5) $F_3 \cdot F_4 = 1$, and if $F_3 \cdot F_4 = 1$, then the data nibble is current balanced.

6. The low weight encoding circuit as claimed in claim 2, wherein said current balance tester is implemented using a look-up TABLE containing logic functions $F_1$, $F_2$, $F_3$ and $F_4$ pre-assigned to different combinations of the input data nibble to test whether the data nibble is current balanced.

7. The low weight encoding circuit as claimed in claim 5, wherein said current balance encoder and decode bit generator is implemented using combinations of Boolean logics including, but not limited to, XOR and XNOR logic gates, initial bit patterns $A_0$, $A_1$, $A_2$ and $A_3$ as parameters representing individual bits in the data nibble of four (4) data bits and the following equations: (1)$\overline{A_0 \oplus A_1 \oplus A_2} \cdot \overline{F_3} = 1$, (2) $\overline{F_3} \cdot F_4 = 1$, and (3)$F_4 = 1$.

8. The low weight encoding circuit as claimed in claim 7, wherein said current balance encoder and decode bit generator is configured to determine if $\overline{A_0 \oplus A_1 \oplus A_2} \cdot \overline{F_3} = 1$, and if $\overline{A_0 \oplus A_1 \oplus A_2} \cdot \overline{F_3} = 1$, invert bit $A_0$ and bit shift the data nibble to the left, carry bit $A_0$ into the $A_3$ position, and generate encoded data and corresponding decode bits.

9. The low weight encoding circuit as claimed in claim 8, wherein said current balance encoder and decode bit generator is configured to determine if $\overline{F_3} \cdot F_4 = 1$, and if $\overline{F_3} \cdot F_4 = 1$, invert bit $A_3$ and bit shift the nibble to the right, carry bit $A_3$ into the $A_0$ position, and generate encoded data and corresponding decode bits.

10. The low weight encoding circuit as claimed in claim 9, wherein said current balance encoder and decode bit generator is configured to determine if $F_4 = 1$ and if $F_4 = 1$, invert bits $A_1$, and $A_3$, and generate encoded data and corresponding decode bits.

11. The low weight encoding circuit as claimed in claim 2, wherein said current balance encoder and decode bit generator is implemented using a look-up TABLE containing encoded nibbles are pre-assigned to different combinations of input data nibbles $A_0$, $A_1$, $A_2$ and $A_3$ that need to be encoded.

12. An electronic system, comprising:
   a power supply;
   an active circuit including a plurality of I/O cells which serve as switching transistors; and
   a power delivery system arranged to deliver a transient current from the power supply to the I/O cells of the active circuit, via an I/O bus, said power delivery system comprising a low weight encoding circuit arranged to encode data bits sent out on the I/O bus such that minimal current drawn is achieved to minimize signal and timing distortions.

13. The electronic system as claimed in claim 12, wherein said low weight encoding circuit comprises:
   a current balance tester arranged to test whether a predetermined number of data bits is current balanced;
   a current balance encoder and decode bit generator arranged to encode data bits and generate encoded data and corresponding decode bits if said predetermined number of data bits is not current balanced; and
   a latch arranged to latch either the data bits, via the I/O bus, if said predetermined number of data bits is current balanced or the encoded data and corresponding decode bits, via the I/O bus, if said predetermined number of data bits is not current balanced.

14. The electronic system as claimed in claim 13, wherein said predetermined number of data bits corresponds to 4 bits or a data nibble from the I/O bus supporting at least 32-bit or 64-bit data transactions.

15. The electronic system as claimed in claim 14, wherein said current balance tester is implemented using combinations of Boolean logics including, but not limited to, XOR and XNOR logic gates arranged to test the data nibble for balanced current drawn using $A_0$, $A_1$, $A_2$ and $A_3$ as parameters representing individual bits in the data nibble of four (4) data bits and the following equations: (1)$F_1 = \overline{A_0 \oplus A_1}$, (2) $F_2 = \overline{A_2 \oplus A_3}$, (3) $F_3 = \overline{F_1 \oplus F_2}$, (4) $F_4 = A_0 \oplus A_1 \oplus A_2 \oplus A_3$ and (5) $F_3 \cdot F_4 = 1$, and if $F_3 \cdot F_4 = 1$, then the data nibble is current balanced.

16. The electronic system as claimed in claim 14, wherein said current balance encoder and decode bit generator is implemented using combinations of Boolean logics including, but not limited to, XOR and XNOR logic gates, initial bit patterns $A_0$, $A_1$, $A_2$ and A3 as parameters representing individual bits in the data nibble of four (4) data bits and the following equations: (1)$\overline{A_0 \oplus A_1 \oplus A_2} \cdot \overline{F_3} = 1$, (2) $\overline{F_3} \cdot F_4 = 1$, and (3)$F_4 = 1$.

17. The electronic system as claimed in claim 16, wherein said current balance encoder and decode bit generator is configured to:
   invert, if $\overline{A_0 \oplus A_1 \oplus A_2} \cdot \overline{F_3} = 1$, bit $A_0$, and bit shift the data nibble to the left, carry bit $A_0$ into the $A_3$ position, and generate encoded data and corresponding decode bits;
   invert, if $\overline{F_3} \cdot F_4 = 1$, bit $A_3$ and bit shift the nibble to the right, carry bit $A_3$ into the $A_0$ position, and generate encoded data and corresponding decode bits; and
   invert, if $F_4 = 1$, bits $A_1$, and $A_3$, and generate encoded data and corresponding decode bits.

18. The electronic system as claimed in claim 16, wherein said current balance encoder and decode bit generator is implemented using a look-up TABLE containing encoded nibbles are pre-assigned to different combinations of input data nibbles $A_0$, $A_1$, $A_2$ and A3 that need to be encoded.

19. A method of encoding data in a power delivery system, comprising:
   determining whether a predetermined number of data bits is current balanced;
   if said predetermined number of data bits is current balanced, driving said predetermined number of data bits onto an I/O bus; and
   if said predetermined number of data bits is not current balanced, encoding said predetermined number of data bits to ensure that said predetermined number of data bits is current balanced prior to being driven onto the I/O bus along with corresponding decode bits as to minimize signal and timing distortions.

20. The method as claimed in claim 19, wherein said predetermined number of data bits corresponds to 4 bits or a data nibble from the I/O bus supporting at least 32-bit or 64-bit data transactions.

* * * * *